United States Patent [19]
Gordon et al.

[11] Patent Number: 5,959,876
[45] Date of Patent: Sep. 28, 1999

[54] SINGLE OR DUAL MESSAGE MULTILEVEL ANALOG SIGNAL RECORDING AND PLAYBACK SYSTEM CONTAINING INDEPENDENTLY CONTROLLED SIGNAL STORAGE SEGMENTS WITH EXTERNALLY SELECTABLE DURATION CAPABILITY

[75] Inventors: Peter E. Gordon, Cambell; Hagop A. Nazarian, San Jose; Bruce O. Jordan, Saratoga; Aditya Raina, Santa Clara; Lawrence D. Engh, Redwood City; Carl R. Palmer, Los Gatos, all of Calif.

[73] Assignee: Information Storage Devices, Inc., San Jose, Calif.

[21] Appl. No.: 09/115,442

[22] Filed: Jul. 14, 1998

[51] Int. Cl.$^6$ .................................................. G11C 11/34
[52] U.S. Cl. ........................................ 365/45; 365/230.03
[58] Field of Search ................................ 365/45, 230.03; 704/270

[56] References Cited

U.S. PATENT DOCUMENTS

| | | | |
|---|---|---|---|
| 4,890,259 | 12/1989 | Simko | 365/45 |
| 4,989,179 | 1/1991 | Simko | 365/45 |
| 5,164,915 | 11/1992 | Blyth | 365/45 |
| 5,241,494 | 8/1993 | Blyth et al. | 365/45 |
| 5,664,060 | 9/1997 | Jarett et al. | 704/270 |
| 5,801,980 | 9/1998 | Wong et al. | 365/45 |
| 5,828,592 | 10/1998 | Tran et al. | 365/45 |

OTHER PUBLICATIONS

*Voice Record and Playback ICs*, Voice Solutions in Silicon, ISD ChipCorder Data Book, 1997 Edition, ISD 1400 Series, Single–Chip Voice Record/Playback Devices 16– and 20–Second Durations, pp. 2–59–2–60.

*Voice Record and Playback ICs*, Voice Solutions in Silicon, ISD ChipCorder Data Book, 1997 Edition, ISD 2532/40/48/64 Products, Single–Chip Voice Record/Playback Devices 32–, 40–, 48–, and 64–second Durations, pp. 2–91–2–115.

*Voice Record and Playback ICs*, Voice Solutions in Silicon, ISD ChipCorder Data Book, 1997 Edition, ISD 1520 Single–Chip, Single–Message Voice Record/Playback Device 16– to 32–Second Durations, pp. 1–14.

*Primary Examiner*—Vu A. Le
*Attorney, Agent, or Firm*—Blakely, Sokoloff, Taylor & Zafman LLP

[57] ABSTRACT

A single chip, single or dual message multilevel analog signal recording and playback system is described. In one embodiment, the system comprises a record circuit, an analog storage array, a playback circuit, and a control circuit that independently controls signal storage segments and duration capability. The record circuit receives an audio signal and generates a filtered signal, which is stored in the analog storage array. The playback circuit is coupled to the storage array for retrieving the stored signal for playback. The system further includes a mixer circuit which receives an auxiliary signal and mixes the auxiliary signal with the stored signal during playback. The control circuit also features a novel audio, visual, and input/output functionality.

36 Claims, 9 Drawing Sheets

SINGLE OR DUAL MESSAGE MULTILEVEL ANALOG SIGNAL RECORDING AND PLAYBACK SYSTEM CONTAINING INDEPENDENTLY CONTROLLED SIGNAL STORAGE SEGMENTS WITH EXTERNALLY SELECTABLE DURATION CAPABILITY

BACKGROUND OF THE INVENTION

1. Field of the Invention

The present invention relates generally to analog recording and playback systems, and specifically, to a single or dual message, multilevel analog signal recording and playback system.

2. Background Information

Multilevel analog signal recording and playback devices have found numerous signal processing applications that require a low-cost, low power consumption, and compact solution. In these applications, analog techniques are preferable to digital techniques because a complete single-chip solution is possible with analog integrated circuits, enabling lower overall system cost for a given functionality or application.

One prior art single chip device for analog signal recording and playback is the ISD 1400 series manufactured by Information Storage Devices, of San Jose, Calif. The ISD 1400 series system is a single/multi message multilevel analog signal Recording and playback system. It has external addressing capability and special end of message (EOM) markers. Writing multiple messages requires the device to selectively clear rows before recording, which, in turn, requires additional pins and internal circuits.

Pending U.S. patent application Ser. No. 08/912,590, entitled "A Single Message Multilevel Analog Signal Recording and Playback System" filed Aug. 18, 1997, and assigned to the assignee of the present invention discloses a system with selectable duration capability.

The ISD 2500 series system enables functionality similar to the ISD 1400 series system with the additional ability to accept external signals as auxiliary inputs. However, it cannot perform a mix in function.

The present invention is an improvement of the aforementioned systems. In a voice application, the present invention offers (1) a single or multiple storage segments including a security feature to prevent overwriting of one or more segments; (2) an auxiliary input/mix in feature; (3) a microphone bias feature; (4) external selectable duration capability; and (5) lower system cost.

SUMMARY OF THE INVENTION

The present invention is a single chip, single or dual message multilevel analog signal recording and playback system. In one embodiment, the system comprises a record circuit, an analog storage array, a playback circuit, and a control circuit that independently controls signal storage segments and duration capability. The record circuit receives an audio signal and generates a filtered signal, which is stored in the analog storage array. The playback circuit is coupled to the storage array for retrieving the stored signal for playback. The system further includes a mixer circuit, which receives an auxiliary signal and mixes the auxiliary signal with the stored signal during playback.

DETAILED DESCRIPTION

The present invention comprises a single-chip, single or dual message multilevel analog recording and playback system. The system is highly integrated with on-chip implementation of many functions, including the ability to independently record and play a first or a second segment, or both segments, the ability to secure one of the segments from being reprogrammed, and the ability to accept an external auxiliary input and mixing such auxiliary input with an analog signal recorded in an analog memory array. In addition, the system provides a novel audio, visual, and input and output functionality. A further feature includes a microphone bias circuitry that provides a controlled voltage source, thus eliminating the need for a large external capacitor and resistor. The present invention offers a single-chip solution in non-volatile storage applications requiring compactness, flexibility, and low power consumption.

Figure 1:
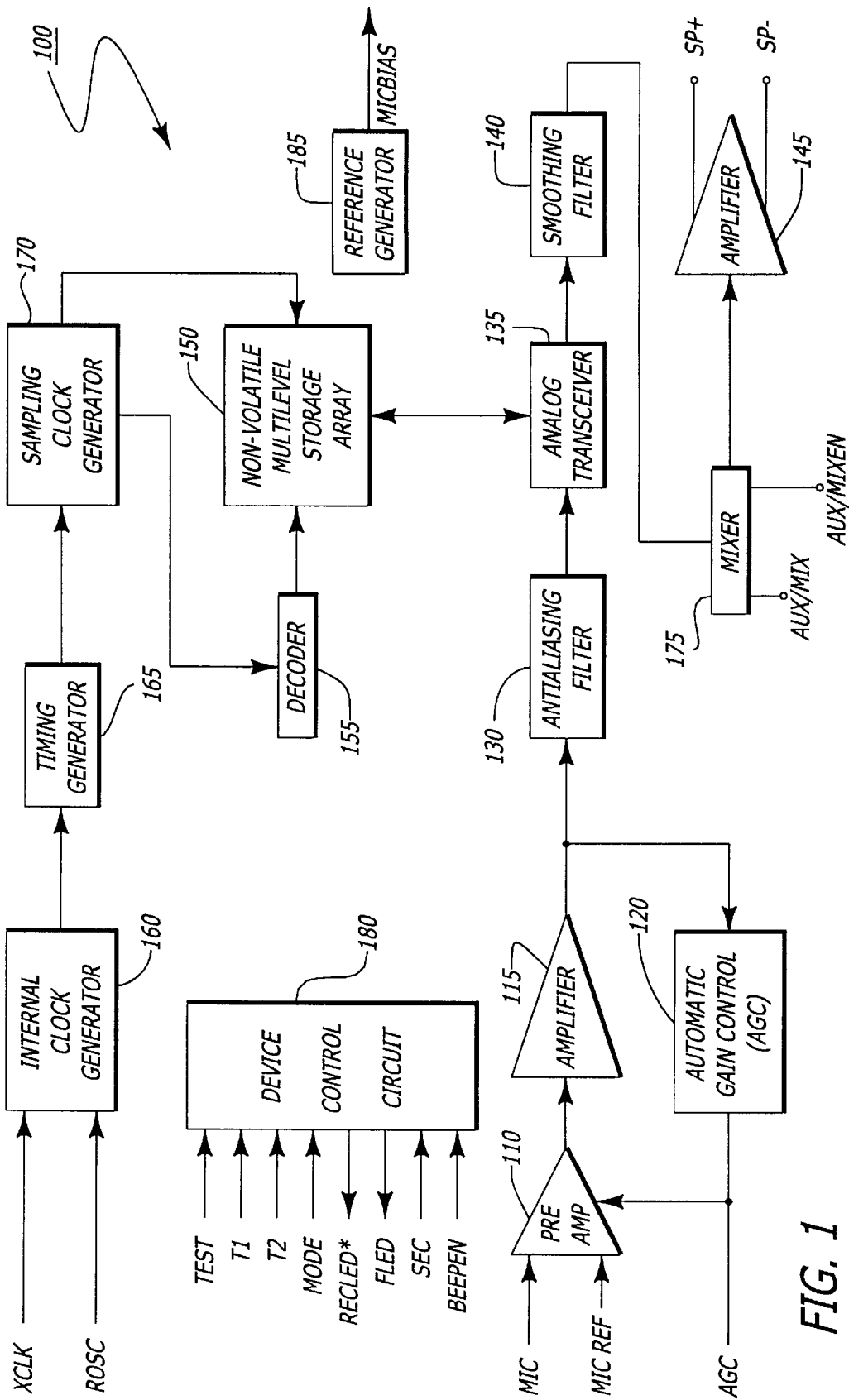
FIG. 1 isle block diagram illustrating one embodiment of the present in invention.

Referring to FIG. 1, a block diagram illustrating one embodiment of the integrated voice circuit system in accordance to the teaching of the present invention is shown. The integrated voice circuit system 100 consists of a pre-amplifier 110, an amplifier 115, an automatic gain control (AGC) circuit 120, an anti-aliasing filter 130, an analog transceiver 135, a smoothing filter 140, an output amplifier 145, a non-volatile multilevel storage array 150, a decoder 155, an internal clock generator 160, a timing generator 165, a sampling clock generator 170, a mixer 175, a device control circuit 180, and a reference generator 185.

The inputs to the device include the microphone input (MIC), microphone reference (MIC_REF), automatic gain control (AGC), external clock (XCLK), resistor controlled oscillator (ROSC), test (TEST), trigger inputs 1 and 2 (T1 and T2), mode input (MODE), segment enable control (SEC), beep enable (BEEPEN), auxiliary/mix (AUX/MIX), auxiliary/mix enable (AUX/MIXEN), and power supply inputs. The outputs from the device include a flash LED output (FLED), speaker outputs (SP+ and SP−), record LED output (RECLED*), and an integrated, regulated microphone bias output (MICBIAS).

There are two distinct paths on the integrated voice circuit system 100, namely, a record path and a playback path. The record path is for recording, writing, or storing analog signals, such as voice signals, into the non-volatile multi-level storage array 150. The playback path is for playing back, reading, or retrieving the voice signals from the non-volatile multi-level storage array 150 and outputting balanced voice signals to a speaker.

The record path comprises the pre-amplifier 110, amplifier 115, AGC circuit 120, anti-aliasing filter 130, analog transceiver 135, and non-volatile multi-level storage array 150. Correspondingly, the playback path comprises the non-volatile multi-level storage array 150, analog transceiver 135, smoothing filter 140, mixer 175, and output amplifier 145. These elements participate in the reconstructing of the message.

Pre-amplifier 110 amplifies the input signal from the MIC inputs. The pre-amplifier output signal is AC coupled to the second stage amplification provided by amplifier 115. The output of the amplifier 115 is fed back through the AGC circuit 120 to adjust the gain of the pre-amplifier 110 to maintain signal quality.

The anti-aliasing filter 130 provides a filtering function to eliminate unwanted high frequency noise, which is above the voice frequency range. The analog transceiver 135 transfers the analog signal to be stored in storage array 150. The analog transceiver 135 also retrieves the analog signal from storage array 150 to be read out and AC couples it to the smoothing filter 140. The analog transceiver 135 is described in more detail later. The smoothing filter 140 provides additional filtering. The mixer 175 allows an external, auxiliary audio signal (AUX/MIX), such as background music stored on an external read-only memory chip, to be mixed with the analog signal that is read from the storage array 150 (e.g., thus providing a sing-along or karaoke effect). The AUX/MIXEN input enables and/or disables mixing of the auxiliary audio signal with the analog signal. In particular, when the AUX/MIXEN input is set to a "1", mixing is enabled, and when set to a "0", mixing is disabled. The output amplifier 145 amplifies the smoothed analog signal to drive the speaker outputs SP+ and SP−. The reference generator 185 generates a bias voltage on the MICBIAS output.

The non-volatile multilevel storage array 150 consists of a number of memory cells (e.g., configured as rows and columns of memory cells) to store the analog signal. The decoder 155 provides the addressing function to the storage array 150.

The internal clock generator 160 receives the XCLK and ROSC inputs to generate clock signals used internally. The timing generator 165 receives the clock signals as generated by the internal clock generator 160 to provide additional timing signals to be used in many internal control circuits. The sampling clock generator 170 provides the sampling clock signal to the storage array 150 and its associated circuitry.

The XCLK input provides a clock input for testing purposes only and is not typically used in systems. The ROSC input provides a means to vary the internal clock frequency. This internal clock frequency depends on the value of the resistor connected from the ROSC input to ground. Changing this resistor value changes the frequency of the internal clock which in turn changes the timing generator and sampling clock generator accordingly.

The changes in clock frequencies change the duration of the recording and the playback. Accordingly, by varying the resistor value at the ROSC input, a multi-duration configuration for message recording and playback is realized. Since recording and playback are two independent processes, this multi-duration configuration can be applied to the record path and the playback path independently. In other words, the recording of a message can be performed with one value of resistor and the playback of a message can be performed with another resistor value or a variable resistor. In this case, the pitch of recorded sound is variable upon playback. It is to be noted that one segment may be recorded using a first resistor value and another segment may be recorded using a second, different resistor value to provide different recording times (different sample rates) for the two segments.

The device control circuit 180 receives control inputs such as the MODE, T1, T2, SEC, and BEEPEN, and generates a number of control signals to various circuits. More specifically, when the MODE pin is a "0", the T1 and T2 inputs are configured as edge sensitive play inputs. When the MODE pin is a "1", the T1 and T2 inputs are configured as level sensitive record inputs. When the MODE pin is floating, the T1 and T2 inputs are configured as level sensitive play inputs. These arrangements provide a user-friendly interface.

During a record operation (with MODE="1"), applying a high level on T1 or T2 will initiate recording of a message on segment 1 (SEG1) or segment 2 (SEG2), respectively. If either T1 or T2 is released before the segment is filled, the recording of the message is terminated, an EOM marker is placed at that point, and the device automatically enters a power down mode. Once a record operation is initiated with either T1 or T2, a further transition on the opposite trigger pin (i.e., T2 or T1) is ignored until the end of the record operation. Applying a high level to both T1 and T2 within a predetermined time (referred to as a "debounce" period) will initiate a recording operation as a single message. A SEG1 overflow is ignored, and the beep tone generated at the end of SEG1 is disabled. Once a record operation has been initiated for a single message (i.e., both T1 and T2 are asserted), a further transition on either T1 or T2 is ignored until T1 and T2 are both pulled low, indicating the end of a record operation.

The recording of a specified segment (either T1 or T2) commences with erasure of that segment first, followed by recording. For example, if both segments each have a message recorded thereon, a further record operation on SEG1 commences with erasure of SEG1 followed by recording on SEG1. The previously recorded message on SEG2 remains unaffected. In the case of recording a single message (i.e., both T1 and T2 are asserted), both segments are first erased, followed by a recording operation.

Table 1 illustrates the operation of T1 and T2 in edge triggering mode (i.e., MODE="0"). If either T1 or T2 is pulsed, SEG1 or SEG2, respectively, is played back until either an EOM is detected or an overflow condition (the end the segment) is reached. If both T1 and T2 are pulsed at the same time within the debounce period, SEG1 is played back, then SEG2 is played back until either an EOM is detected or overflow of SEG2 is reached. If T2 is pulsed while SEG1 is in playback, the chip skips to the beginning of SEG2 and plays back SEG2 until either an EOM is detected or an overflow of SEG2 is reached. Similarly if T1 is pulsed while SEG2 is in playback, then the chip skips to the beginning of SEG1 and plays back SEG1 until either an EOM is detected or an overflow of SEG1 is reached.

TABLE 1

Edge Triggering conditions - PLAY

| Play Edge Conditions | Action |
|---|---|
| T1 is pulsed | Playback SEG1 until either an EOM condition is detected or the overflow of SEG1 is reached. |
| T2 is pulsed | Playback SEG2 until either an EOM condition is detected or the overflow of SEG2 is reached. |
| T1 and T2 are pulsed | Playback SEG1 message then SEG2 message until either an EOM condition is detected or the overflow of SEG2 is reached. |
| T2 pulsed while SEG1 is in Playback | Skip to beginning of SEG2 and continue playback until an EOM condition is detected or the overflow of SEG2 is reached. |
| T1 pulsed while SEG2 is in Playback | Skip to beginning of SEG1 and continue playback until an EOM condition is detected or the overflow of SEG1 is reached. |

Table 2 illustrates the operation of T1 and T2 in level triggering mode (i.e., MODE="floating"). If either T1 or T2 is asserted, SEG1 or SEG2, respectively, is played back until T1 or T2 is de-asserted, an EOM is detected, or overflow of SEG1 or SEG2 is reached. If T1 and T2 are both activated during the debounce period, then SEG1 followed by SEG2 is played back until T1 and T2 are both pulled low, an EOM condition is detected, or the overflow of SEG2 is reached. It must be noted that the record operation takes precedence over playback. Thus, if, while the chip is playing a message, the MODE input is taken high and either T1 or T2 is asserted, the chip will stop playing and record at the beginning of the selected segment.

TABLE 2

Level Triggering Conditions - PLAY

| Play Level Conditions | Action |
|---|---|
| T1 is set high | Playback SEG1 until T1 pin is pulled low, EOM is detected, or overflow of SEG1 is reached. |
| T2 is set high | Playback SEG2 until T2 pin is pulled low, EOM is detected, or overflow of SEG2 is reached. |
| T1 and T2 are both set high during the debounce period | Playback SEG1 then SEG2 until T1 and T2 pins are both pulled low, EOM is detected, or overflow of SEG2 is reached. |

The SEC input pin prevents recording on SEG1 when set to a "1". Recording on SEG1 is allowed when the SEC pin is set to a "0". If, while the SEC input is high, a record operation of SEG1 is detected (i.e., MODE=1, T1=1, and T2=0), the chip remains in the power down mode. However, if, while the SEC input is high, a record operation of SEG2 (T1=0 and T2=1) or a single message record operation (T1=1 and T2=1) is detected, the chip records on the SEG2.

The BEEPEN input pin, when set, enables a beep tone function. More specifically, at the beginning of recording, a short beep tone is internally generated and outputted on the speaker outputs SP+ and SP−, indicating the start of a record operation. In addition, another short beep tone, which may be different in frequency than the beep tone generated at the beginning of recording, is generated and outputted on the speaker outputs SP+ and SP− on an overflow of a segment, or in the case of a single message, on an overflow of the second segment.

The device outputs a RECLED* output which turns on a light emitting diode (LED) during recording. The device also outputs a FLED output that drives a LED to flash at a low frequency (e.g., approximately 3 Hz) during playback. The LED is to be connected between a positive power supply and the FLED pin. The MICBIAS output provides a predetermined bias voltage to the microphone, which eliminates the need for a large external capacitor and a resistor.

Figure 10:
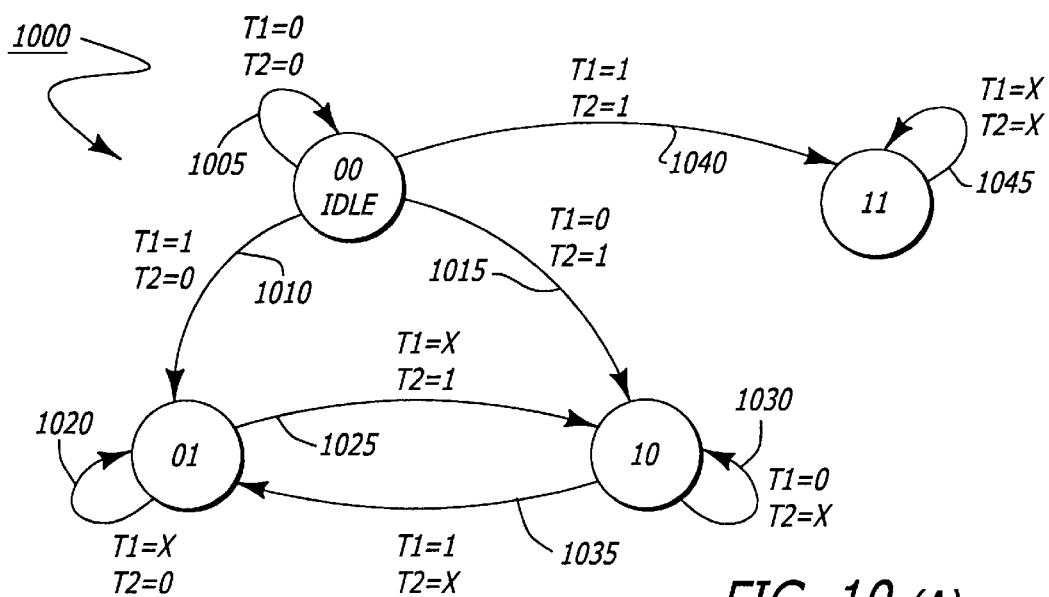
FIG. 10(A) is a state diagram illustrating a partial operation of the device control circuit with respect to the T1 and T2 trigger inputs.
FIG. 10(B) is an exemplary circuit implementation of the state diagram of FIG. 10(A).
FIG. 10(C) is a block diagram of a portion of the device control circuit, according to one embodiment of the present invention.
Figure 10:
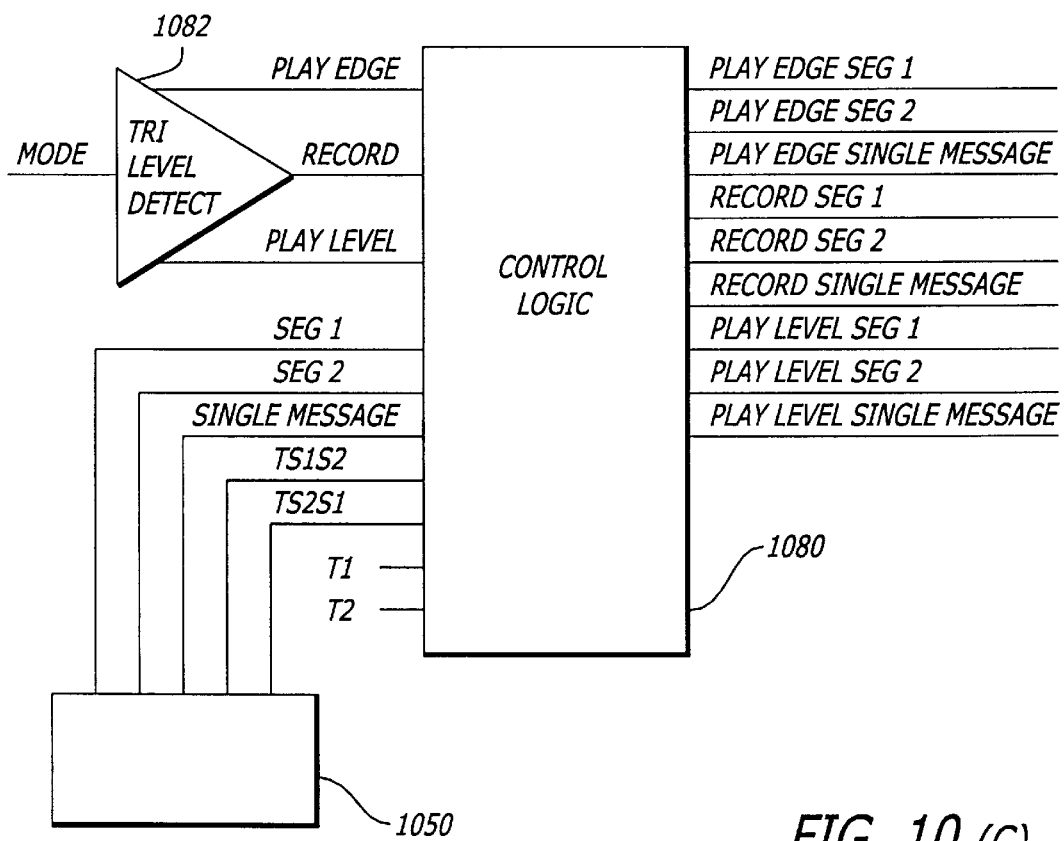
Figure 10:
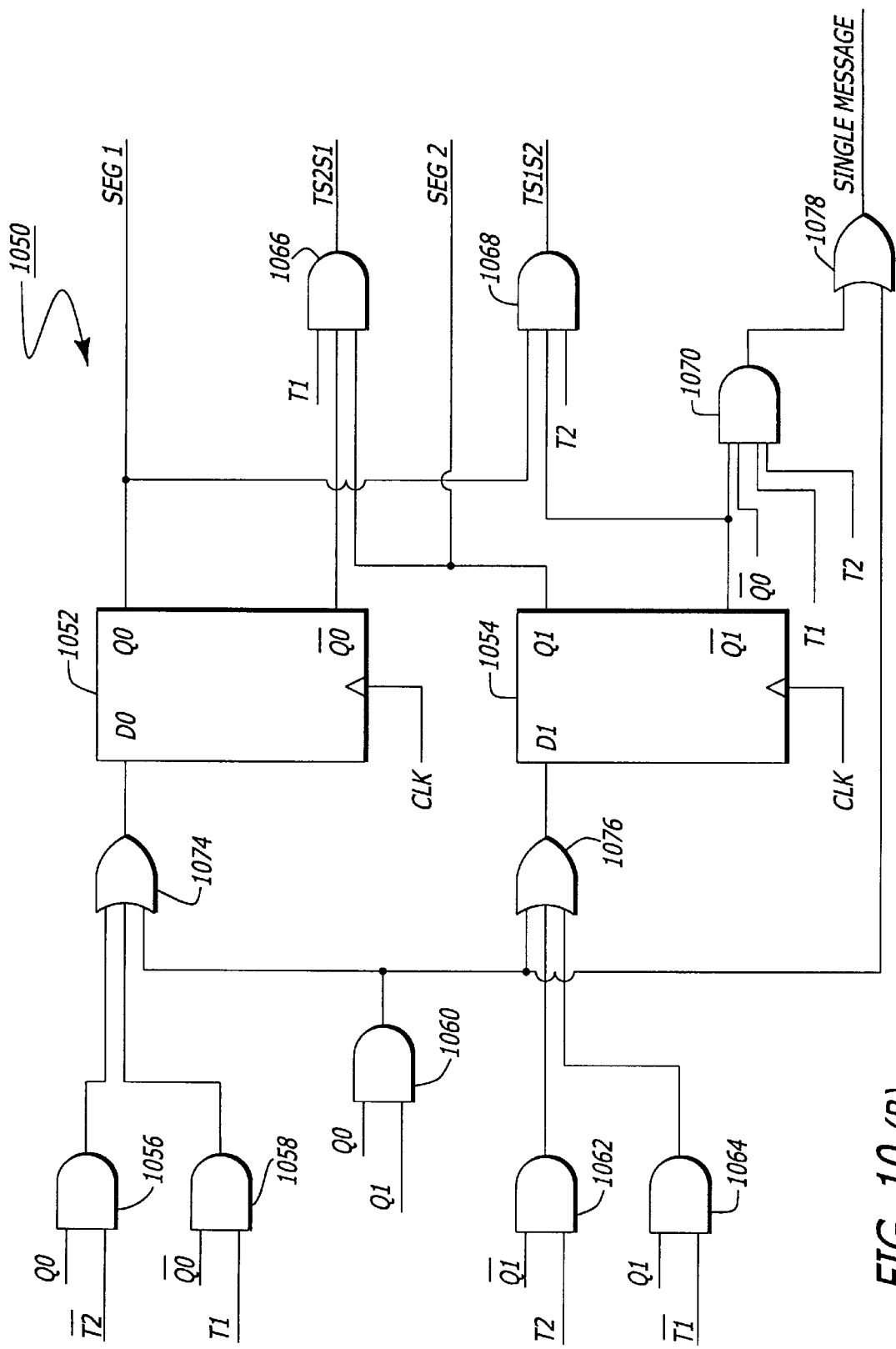

FIG. 10(A) is a state diagram 1000 illustrating a partial operation of the device control circuit 180 with respect to the T1 and T2 inputs. As shown in FIG. 10(A), the state machine idle state is state 00 (S00), which is the power down state, and the inputs to the state machine are the T1 and T2 trigger inputs. At S00, if both T1 and T2 are low, the state remains the same, as shown by arrow 1005. However, if either T1 or T2 3goes high, then the state changes to S01, as shown by arrow 1010 or S10, as shown by arrow 1015, respectively. At S01, if T2 is low, irrespective of T1, the state remains the same, as shown by arrow 1020. At S01, if T2 is high, irrespective of T1, the state changes to S10, as shown by arrow 1025. Correspondingly, at S10, if T1 is low, irrespective of T2, the state remains the same, as shown by arrow 1030. At S10, if T1 is high, irrespective of T2, the state changes to S01, as shown by arrow 1035.

If at S00, both T1 and T2 are high, indicating that a single message is to be played or recorded, the state changes to S11, as shown by arrow 1040. At S11, the state remains the same irrespective of T1 and T2, as shown by arrow 1045. When the device control circuit 180 detects an EOM, an overflow condition, a termination of recording, or a termination of a level play (PLAYLEVEL), the state machine enters the idle state (i.e., S00) and the chip powers down.

FIG. 10(B) is an exemplary circuit implementation of the state diagram of FIG. 10(A). Referring to FIG. 10(B), the circuit 1050 includes D-type flip-flops 1052–1054, AND gates 1056–1070, and OR gates 1074–1078. A clock CLK input is used to latch the flip-flops. The inputs to the circuit 1050 are T1 and T2 while the outputs are SEG1, SEG2, TS1S2, TS2S1, and SINGLEMESSAGE. SEG1 is high at states S01 and S11 whereas SEG2 is high at states S10 and S11. At S01, if T2 goes high, the TS1S2 output transitions from a low to a high. Similarly, at S10, if T1 goes high, the TS2S1 output transitions from a low to a high. At S00, if both T1 and T2 go high, the SINGLEMESSAGE output transitions from a low to a high. Although the exemplary circuit of FIG. 10(B) is clocked using a master clock (CLK), the circuit may be implemented using combinational logic, without the need for a clock.

FIG. 10(C) is a block diagram of a portion of the device control circuit 180, according to one embodiment of the present invention. Referring to FIG. 10(C), a circuit 1080 is shown having as inputs PLAYLEVEL, PLAYEDGE, RECORD, the five outputs of the circuit 1050 of FIG. 10(B), and the T1 and T2 trigger inputs. The PLAYLEVEL, PLAYEDGE, and RECORD inputs are generates from a single MODE input to the device control circuit 180 of FIG. 1. In particular, the MODE input is applied to a tri-detect buffer circuit 1082, which asserts one of the PLAYLEVEL, PLAYEDGE, and RECORD signals, responsive to the state of the MODE input. That is, if the MODE input is low, the PLAYEDGE signal is asserted, if the MODE input is high, the RECORD signal is asserted, and if the MODE input is floating, the PLAYLEVEL signal is asserted. The circuit 1080, responsive to the inputs, asserts one of nine output signals. These output signals of the circuit 1080 are used to control various portions of the associated control circuitry for the storage array 150 of FIG. 1.

Figure 2:
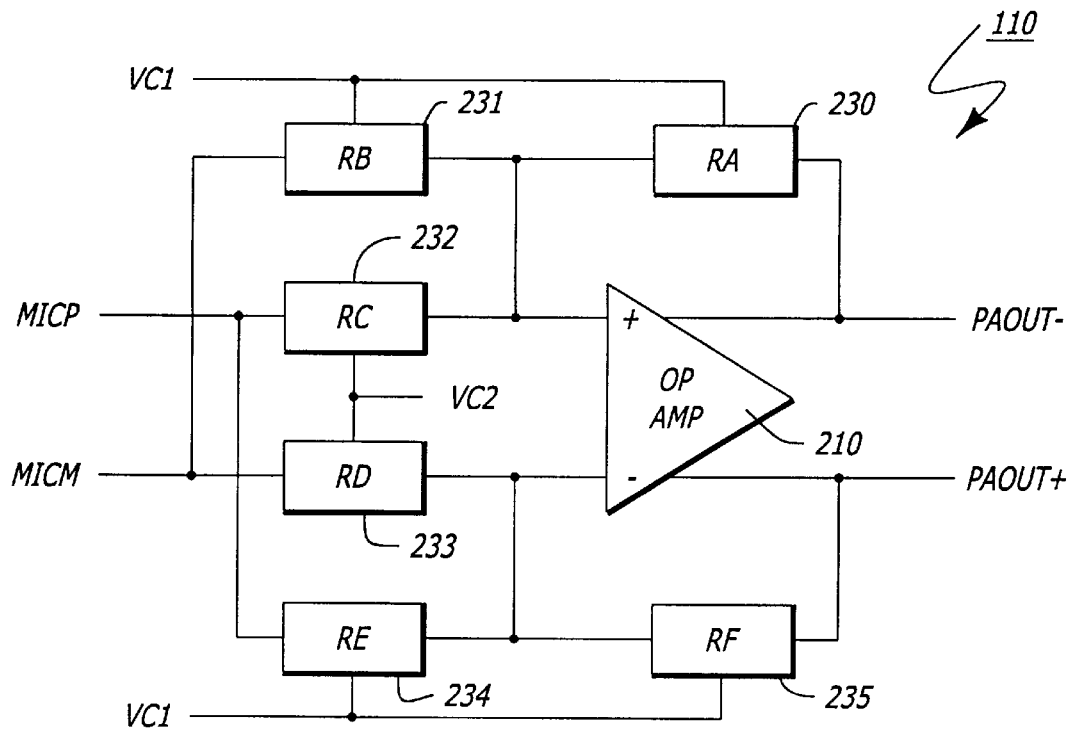
FIG. 2(A) is a block diagram illustrating one embodiment of the pre-amplifier stage in accordance to the teaching of the present invention.
FIG. 2(B) is a block diagram illustrating one embodiment of the automatic gain control in accordance to the teaching of the present invention.
Figure 2:
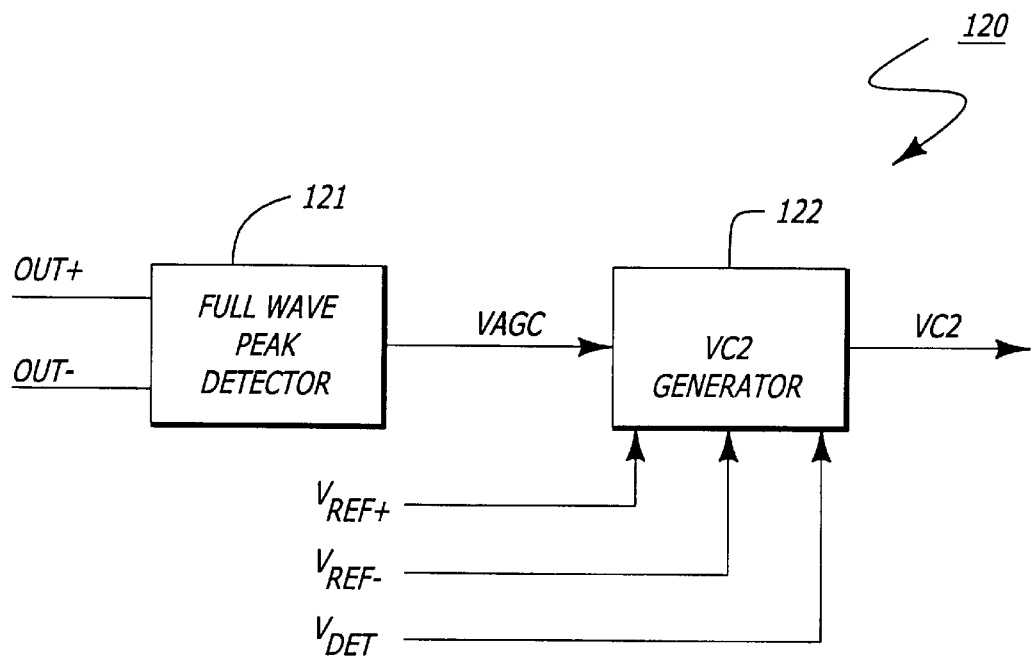

Referring to FIG. 2(A), a block diagram illustrating one embodiment of the pre-amplifier stage in accordance to the teaching of the present invention is shown. The pre-amplifier 110 consists of operational amplifier (op amp) 210, voltage controlled MOS resistors RA 230, RB 231, RC 232, RD 233, RE 234, and RF 235. The inputs to the pre-amplifier 110 are MICP and MICM having voltage values of VMICP and VMICM, respectively. The outputs of the pre-amplifier 110 are the PAOUT– and PAOUT+.

The voltage controlled resistors RA 230, RB 231, RE 234, and RF 235 have fixed values set by the constant voltage VC1. The voltage controlled resistors RC 232 and RD 233 have variable values determined by variable voltage VC2. Using voltage controlled resistors provide a wide dynamic range for the inputs while reducing signal distortion. In addition, the maximum gain is a controlled parameter because the signal gain is controlled by the ratio of the resistor values.

Referring to FIG. 2(B), a block diagram illustrating one embodiment of the automatic gain control in accordance to the teaching of the present invention is shown. The automatic gain control (AGC) circuit 120 consists of a full-wave peak detector 121 and a VC2 generator 122. The inputs to the AGC circuit 120 are the two outputs of the second stage amplifier 115, OUT+ and OUT–. The output of the AGC circuit 120 is the variable voltage VC2 used in the pre-amplifier 110.

The full-wave peak detector 121 has a faster response time than the half-wave detector and provides a lower ripple output. The VC2 generator 122 receives the reference voltages VREF+ and VREF– and a constant voltage VDET. The VC2 generator 122 monitors the change in the VAGC value by comparing the VAGC with the reference voltages VREF+ and VREF–, and produces the VC2 voltage accordingly.

Figure 3:
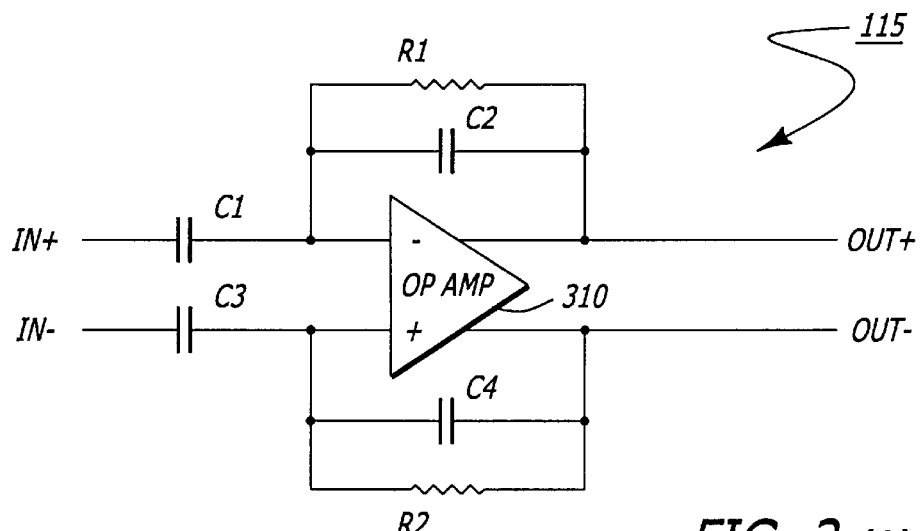
FIG. 3(A) is a circuit diagram illustrating the conceptual design of one embodiment of the amplifier stage.
FIG. 3(B) is a circuit diagram illustrating the design of the embodiment shown in FIG. 3(A).
Figure 3:
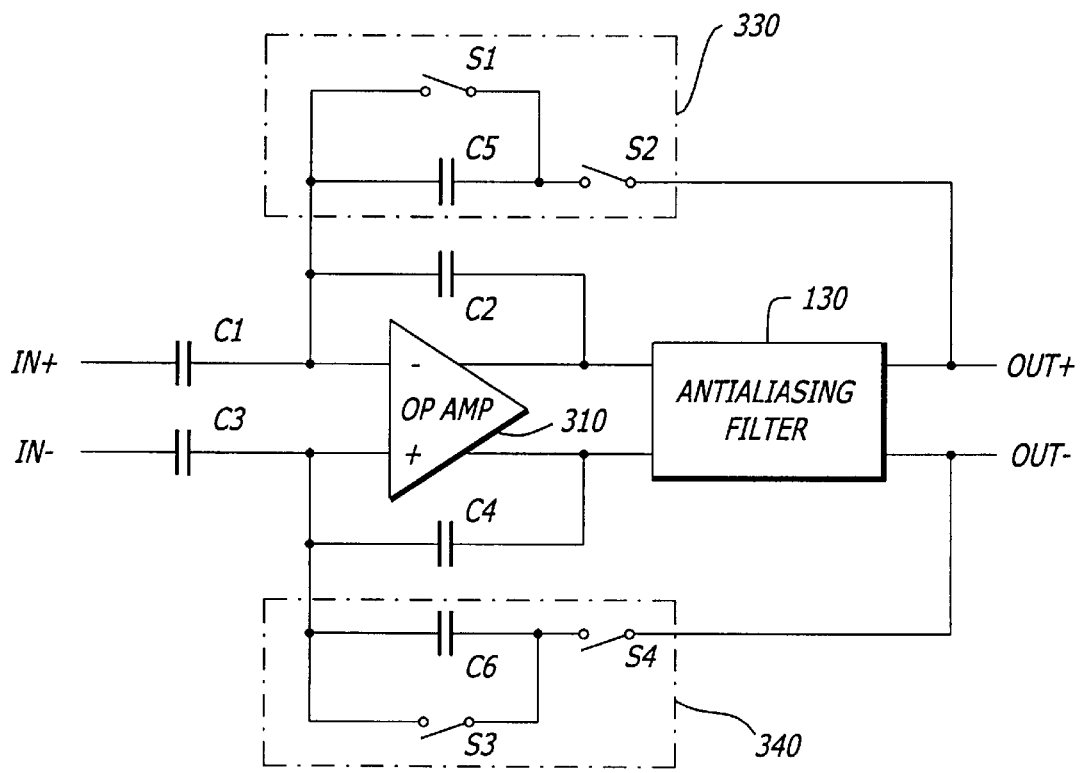

Referring to FIG. 3(A), a circuit diagram illustrating one embodiment of the amplifier 115 is shown. The amplifier 115 consists of op amp 310, capacitors C1, C2, C3, and C4, and resistors R1 and R2. The inputs to the amplifier 115 are IN+ and IN–. The outputs of the amplifier 115 are OUT+ and OUT–. In this embodiment, a differential approach is shown. A single-ended approach can be similarly designed.

To avoid large resistor values for low frequency filter poles, the present invention simulates resistors by a switched capacitor technique.

Referring to FIG. 3(B), a circuit diagram illustrating one embodiment of the switched-capacitor design is shown. The amplifier 115 consists of op amp 310, capacitors C1, C2, C3, and C4, and switched capacitor resistors 330 and 340 which replace resistors R1 and R2 of FIG. 3(A), respectively. Switched capacitor 330 consists of switches S1 and S2 and capacitor C5. Similarly, switched capacitor 340 consists of switches S3 and S4 and capacitor C6. These two switched-capacitor resistors provide DC feedback to the op amp 310. The anti-aliasing filter 320 is used to reduce aliasing distortion.

The output signal of the anti-aliasing filter 320 goes to the analog transceiver 135 to be stored in the storage array 150. The analog transceiver 135 also provides the reading or retrieving of the stored analog signals in the storage array 150 for outputting to the output amplifier 145 through the smoothing filter 140 and the mixer 175.

Figure 4:
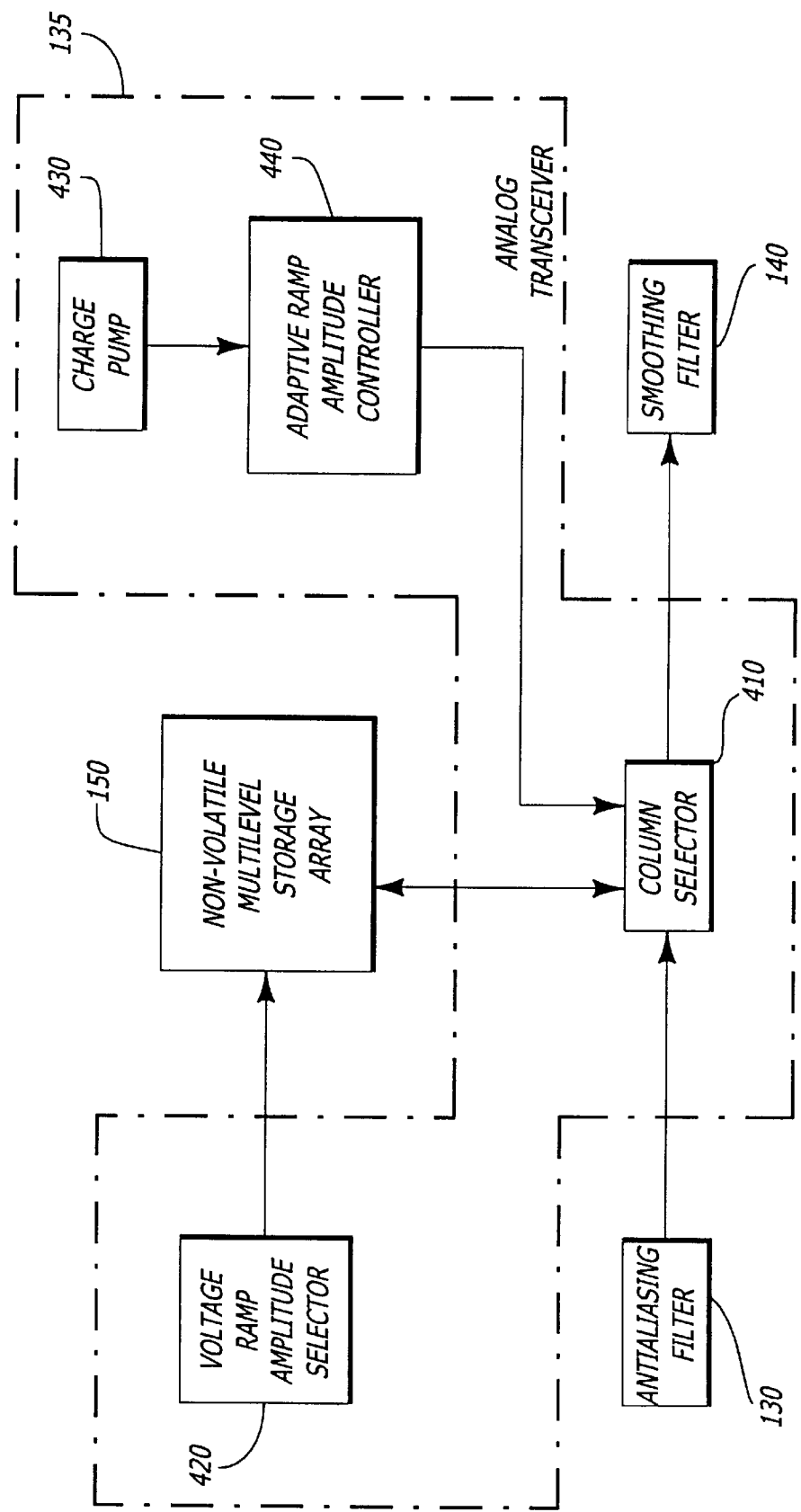
FIG. 4 is a block diagram illustrating one embodiment of the analog transceiver.

Referring to FIG. 4, a block diagram of one embodiment of the analog transceiver 135 is shown. The analog transceiver 135 comprises a column selector 410, a voltage ramp amplitude selector 420, a charge pump 430, and an adaptive ramp amplitude controller 440.

The column selector 410 selects the column in the storage array 150 for storing the analog signal or for reading the stored analog signal. The column selector 410 is coupled to the anti-aliasing filter 130 and the smoothing filter 140. During recording, the column selector provides a signal path between the anti-aliasing filter 130 and the storage array 150. During playback, the column selector provides a signal path between the storage array 150 and the smoothing filter 140. The anti-aliasing filter 130 and the smoothing filter 140 may correspond to the same filter element. The conditioned signal from the anti-aliasing filter 130 is adjusted to the appropriate voltage range to be stored in the non-volatile multilevel storage array 150.

The voltage ramp amplitude selector 420 selects an appropriate voltage ramp amplitude to adjust the programming of the non-volatile memory cells in the storage array 150. The charge pump 430 generates an appropriate high voltage level for erasing and programming the memory cells. The adaptive ramp amplitude controller 440 regulates the voltage applied to the memory cells.

Figure 5:
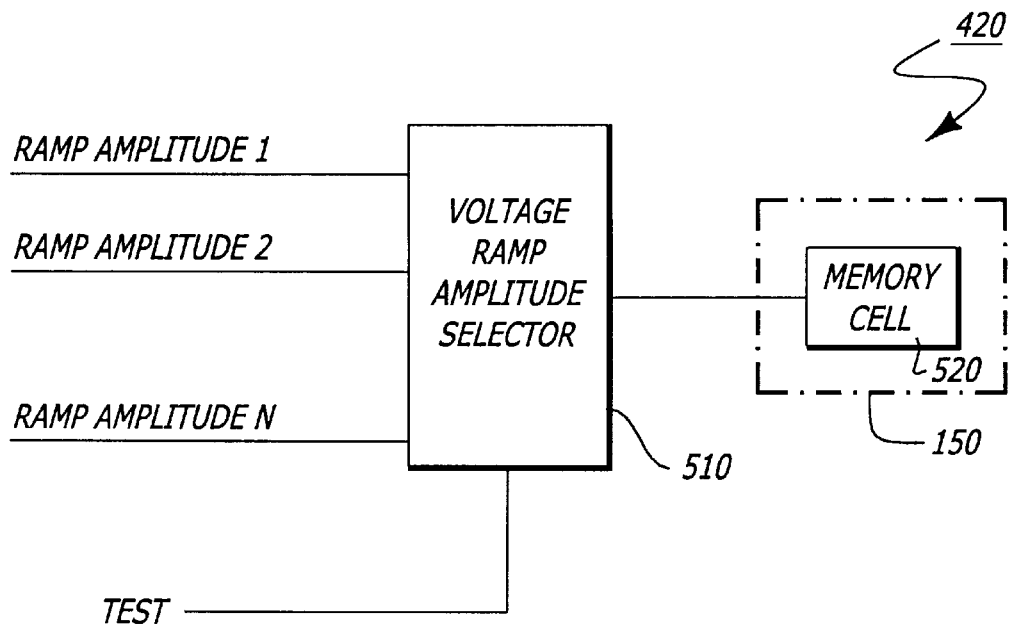
FIG. 5 is block diagram illustrating one embodiment of the voltage ramp amplitude controller.

Referring to FIG. 5, a block diagram illustrating one embodiment of the voltage ramp amplitude selector 420 is shown. The voltage ramp amplitude selector 420 provides a way to adjust the programming of the non-volatile memory cells. The voltage ramp amplitude selector 420 comprises a selector 510 and the corresponding memory cell 520 in the storage array 150.

The selector 510 selects one of several preset voltage ramp amplitudes 1 through N. The selection can be performed by a group of memory cells which can be changed during testing. The selector 510 provides an accurate means to adjust the programming voltage. It also improves the wide margin for multilevel storage cells.

Figure 6:
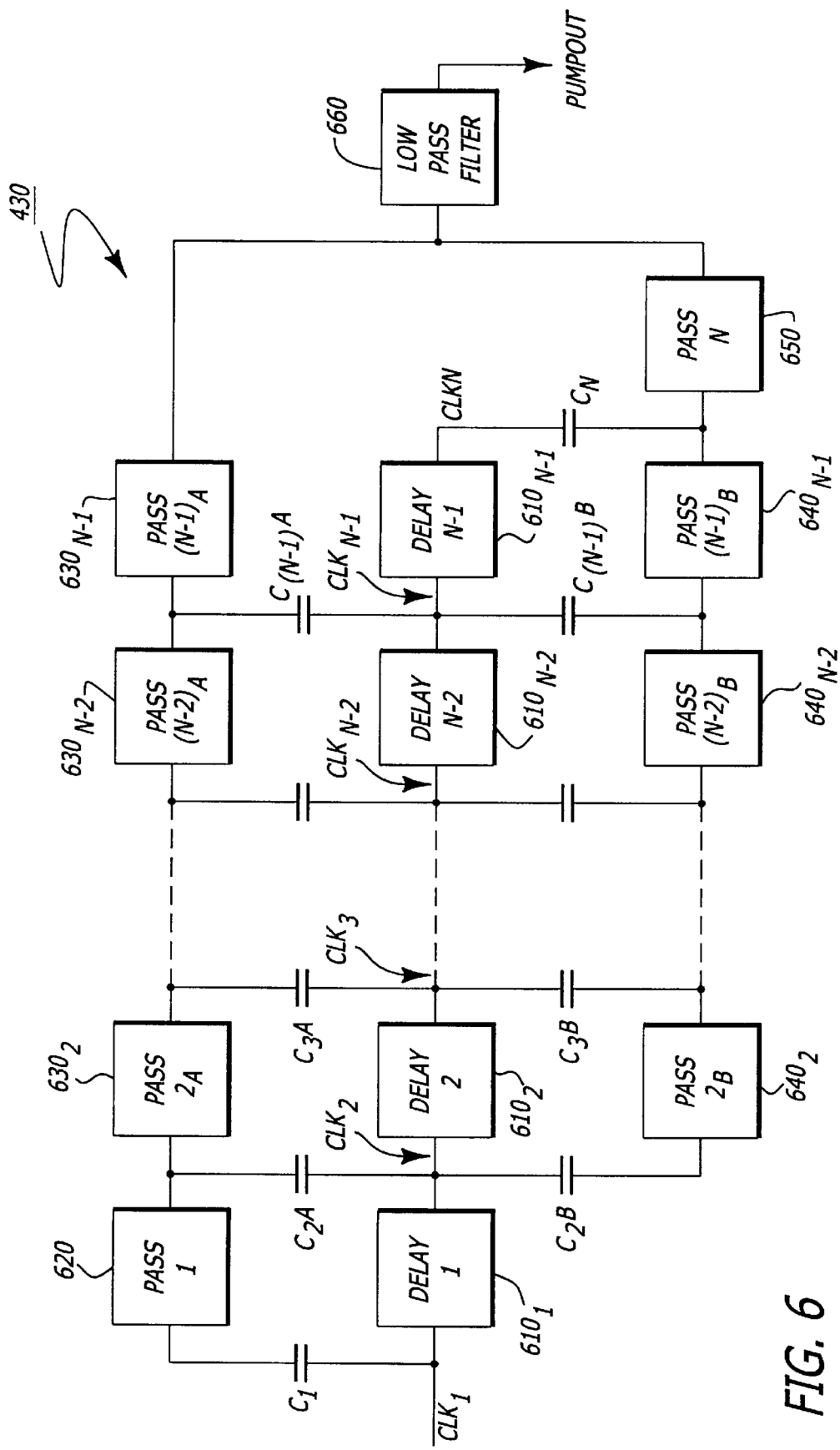
FIG. 6 is a block diagram illustrating one embodiment of the charge pump, for programming the storage array.

Referring to FIG. 6, a block diagram illustrating one embodiment of a circuit to generate the charge pump is shown. The circuit shown in FIG. 6 provides improved performance by reducing the power supply spikes and circuit area. The charge pump circuit 430 consists of DELAY1 $610_1$ through DELAY N–1 $610_{(N-1)}$), PASS 1 620, PASS 2A $630_2$ through PASS (N–1) $630_{N-1}$, PASS 2B $640_2$ through PASS (N–1) $640_{N-1}$, PASS N 650, capacitors C1, $C_iA$ (i=2 to N–1), CjB (j=2 to N–1), $C_N$, and low pass filter 660.

DELAY 1 $610_1$ through DELAY N–1 $610_{N-1}$ delay the clock signal by an appropriate time. With the delay clock line, only one source is needed. Each clock delay driver drives at most two capacitors and the next delay stage. Since the load for each clock is small, being proportional to 2C where C is the capacitors in the delay line, the current surge on the power supply is small and is distributed over the chain of the delay line.

Figure 7:
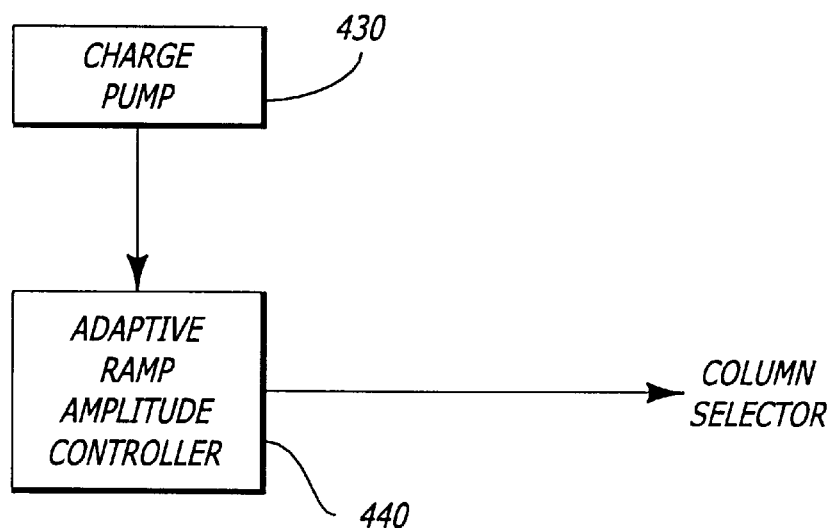
FIG. 7 is a block diagram illustrating one embodiment of the adaptive ramp amplitude controller.

Referring to FIG. 7, a block diagram illustrating one embodiment of the adaptive ramp amplitude controller 440 is shown. The adaptive ramp amplitude controller 440 is coupled to the charge pump 430 and the column selector 410 as shown in FIG. 4. The charge pump 430 provides the programming and the erasing voltages. The controller 440 regulates how fast and how high the voltage is applied to the non-volatile memory cell. This process erases and programs the memory cells. Since the programming voltage applied to the memory cell is a ramp function, many different voltage levels within the programming voltage range can be stored. It is not limited to discrete levels. The circuit reduces circuit complexity, saves area, and improves reliability.

Charge pump 430 provides a constant voltage source for programming and erasing the memory cell. The controller 440 generates the high voltage ramp by only one coarse and two fine ramp pulses. The controller 440, however, can generate the high voltage ramp by any combination of coarse and fine ramp pulses. The column selector 410 controls the flow of the signals and selects the appropriate column on the non-volatile memory array.

Figure 8:
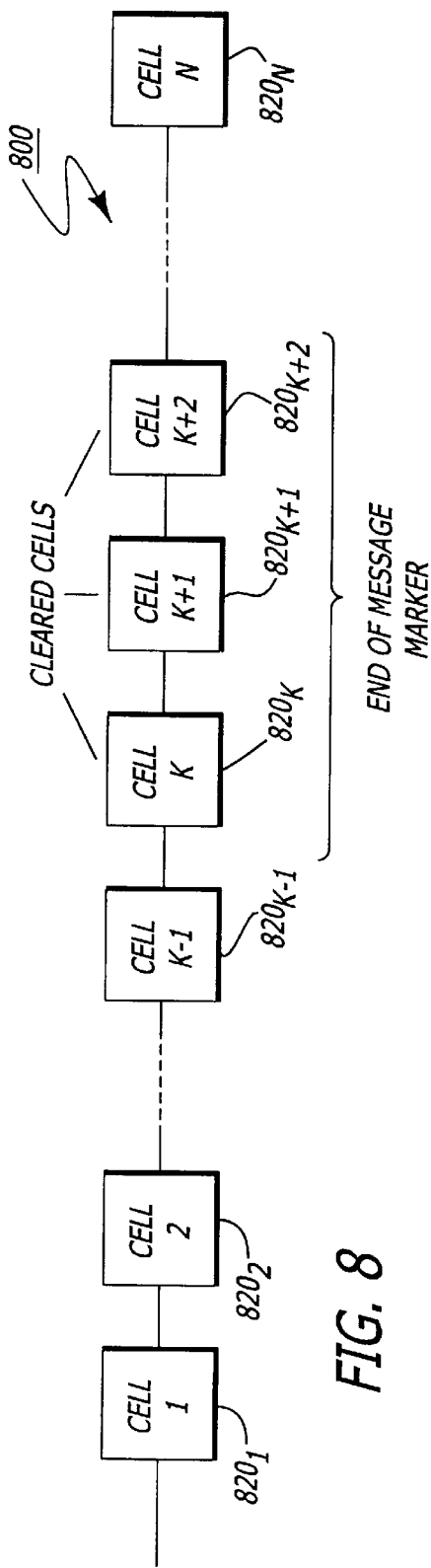
FIG. 8 is block diagram illustrating one embodiment of the end of message markers.

The playback of the message is terminated with either an end of message (EOM) marker or the end of the non-volatile storage array. Referring to FIG. 8, a block diagram illustrating one embodiment of the end of message marker is shown. The end of message (EOM) marker 800 consists of a number of cleared cells in N memory cells $820_1$ through $820_N$.

The EOM marking is implemented by detecting three consecutive cleared cells CELL K, CELL K+1 and CELL K+2. Three consecutive fully cleared cells ensure that the EOM is reliably identified because the probability that three consecutive cells are cleared by defects is extremely low.

Figure 9:
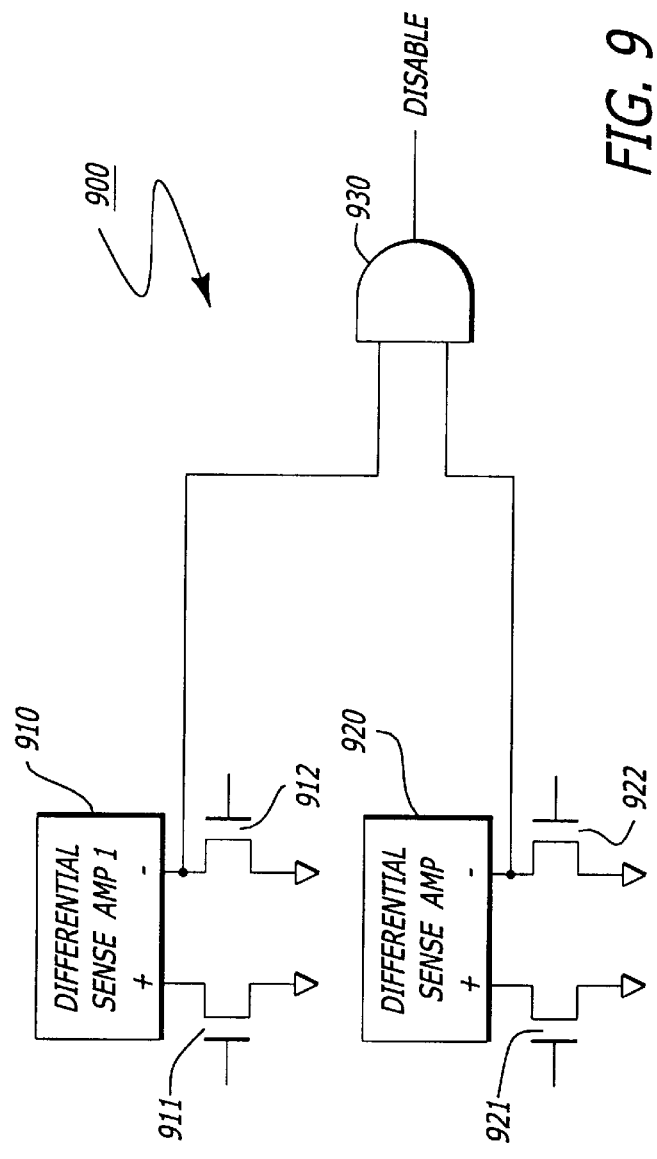
FIG. 9 is a block diagram illustrating one embodiment of the disabling controller.

Referring to FIG. 9, a circuit diagram illustrating one embodiment of a disabling controller 900 that enables disabling of failed devices. The disabling controller 900 consists of differential sense amplifiers 910 and 920, four nonvolatile cells 911, 912, 921 and 922, and AND gate 930. During testing, if the device fails specifications, the four cells 911, 912, 921 and 922 will be programmed accordingly and the disabling output is asserted to prevent the device from playing.

This circuit lowers the customer return rate because the failed device is identified easily.

Other improvements help reduce area, minimize pin-outs, and minimize noise. For example, separate supply power and ground inputs for analog and digital circuits are provided through separate power buses. The user also has a means for knowing when the message is ended by monitoring the output signal on the RECLED* pin. This signal momentarily pulses low and the device powers down.

One application of the present invention includes using the single or dual message analog signal recording and playback system as an advertisement specific, integrated circuit. That is, marketing campaigns may be able to utilize one segment of the dual segment device to pre-record a branding message and lock that message (by pulling the SEC pin high), while leaving the second segment available for users to send personalized messages to clients. An example includes a car dealership handing out marketing brochures with a voice advertisement from the manufacturer in one segment, and a personalized message from the car salesman, in the other segment.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An integrated circuit for processing messages comprising:
   an analog storage array divided into at least first and second segments, each segment including a plurality of memory cells;
   an input circuit coupled to the analog storage array to store messages in the analog storage array during a record operation;
   an output circuit coupled to the analog storage array to retrieve messages from the analog storage array during a playback operation; and
   a control circuit coupled to the analog storage array, the control circuit to control operation of one or both of the first and second segments, responsive to inputs coupled thereto.

2. The integrated circuit of claim 1, wherein the control circuit includes first, second, and third inputs, which are controlled by an external source.

3. The integrated circuit of claim 2, wherein the control circuit to initiate a record operation to the first segment and alternatively to the second segment in the storage array, responsive to the first input being asserted and alternatively to the second input being asserted, respectively, and to the third input being at a first state.

4. The integrated circuit of claim 3, wherein the control circuit to terminate the record operation to the first segment and alternatively to the second segment, responsive to the first input being released and alternatively to the second input being released, respectively.

5. The integrated circuit of claim 2, wherein the control circuit to initiate a record operation to the first and second segments in the storage array, responsive to the first and second inputs being asserted, and to the third input being at a first state.

6. The integrated circuit of claim 5, wherein the control circuit to terminate the record operation to the first and second segments in the storage array, responsive to the first and second inputs being released.

7. The integrated circuit of claim 2, wherein the control circuit to initiate a play operation from the first segment and alternatively to the second segment in the storage array, responsive to the first input being asserted and alternatively to the second input being asserted, respectively, and to the third input being at a second state.

8. The integrated circuit of claim 7, wherein the control circuit to terminate the play operation from the first segment and alternatively to the second segment in the storage array, responsive to the first input and alternatively to the second input being released, respectively.

9. The integrated circuit of claim 2, wherein the control circuit to initiate a play operation from the first and second segments in the storage array, responsive to the first and second inputs being asserted, and to the third input being at a second state.

10. The integrated circuit of claim 9, wherein the control circuit to terminate the play operation from the first and second segments in the storage array, responsive to the first and the second inputs being released.

11. The integrated circuit of claim 3, wherein the control circuit includes a fourth input, the control circuit to prevent recording of one of the first and second segments in the storage array, responsive to the fourth input being asserted.

12. The integrated circuit of claim 1, wherein the control circuit includes a fourth input, the control circuit to cause the output circuit to generate a short tone at the beginning of a record operation, responsive to the fourth input.

13. The integrated circuit of claim 1, wherein the control circuit to cause the output circuit to generate a short tone when there is an overflow during a record operation.

14. The integrated circuit of claim 1 further comprising a clock generator for generating timing signals to control writing and reading of messages to the storage array.

15. The integrated circuit of claim 14, wherein the timing signals control a recording duration of the first and second segments by varying a first resistor value and a playback duration of the first and second segments by varying a second resistor value.

16. The integrated circuit of claim 1, wherein the input circuit comprises: a first amplifier having a variable gain;
   a second amplifier coupled to the first amplifier for providing an amplified signal;
   an automatic gain control (AGC) circuit coupled to the first and second amplifiers for providing a control voltage to adjust the variable gain; and
   an anti-aliasing filter coupled to the second amplifier for providing a filtered signal.

17. The integrated circuit of claim 1 further comprising an analog transceiver coupled to the storage array for storing analog signals to and retrieving analog signals from the storage array.

18. The integrated circuit of claim 17, wherein the analog transceiver comprises:
   a column selector coupled to the storage array for selecting columns for storing signals to and retrieving signals from the storage array;
   an adaptive ramp amplitude controller coupled to said column selector for controlling an application of a programming voltage to the storage array, said programming voltage being used to write to the plurality of non-volatile memory cells in storing a signal;
   a charge pump coupled to said adaptive ramp amplitude controller for generating said programming voltage; and
   a ramp amplitude selector coupled to the storage array for selecting a comparing voltage in adjusting said programming voltage.

19. The integrated circuit of claim 1, wherein the output circuit comprises:
   a smoothing filter for smoothing a signal retrieved from said analog storage circuit to produce a smoothed signal; and
   an output amplifier coupled to said smoothing filter for amplifying said smoothed signal to produce an amplified output signal.

20. The integrated circuit of claim 19 further comprising a mixer circuit coupled between the smoothing filter and the output amplifier, said mixer circuit to mix an external auxiliary input with the smoothed signal during playback.

21. An integrated circuit for processing signals, comprising:
   an analog storage array divided into at least first and second segments, each of which includes a plurality of memory cells; and
   a control circuit coupled to the analog storage array, the control circuit to cause an analog signal to be stored in and retrieved from one or both of the first and second segments, responsive to inputs coupled to the control circuit.

22. The integrated circuit of claim 21, wherein the control circuit to initiate storing of a signal to the first segment and alternatively to the second segment of the storage array, responsive to a first input being asserted and alternatively to a second input being asserted, respectively, and to a third input being at a first state.

23. The integrated circuit of claim 21, wherein the control circuit to initiate storing of a signal to the first and second segments of the storage array, responsive to first and second inputs being asserted, and to a third input being at a first state.

24. The integrated circuit of claim 22, wherein the control circuit to initiate retrieving of a stored signal from the first segment and alternatively from the second segment of the storage array, responsive to a first input being asserted and alternatively to a second input being asserted, respectively, and to a third input being at a second state.

25. The integrated circuit of claim 23, wherein the control circuit to initiate retrieving of a stored signal from the first segment and the second segment of the storage array, responsive to first and second inputs being asserted, and to a third input being at a second state.

26. The integrated circuit of claim 21, wherein the control circuit to prevent storing of signals to one of the first and second segments in the storage array, responsive to an input.

27. The integrated circuit of claim 21, wherein the control circuit to store and retrieve messages in the first and second segments independently.

28. An integrated circuit signal recording and playback system, comprising:
   an analog storage array divided into at least first and second fixed segments, each segment including a plurality of memory cells;
   an input path coupled to the analog storage array to store messages in the analog storage array during a record operation;
   an output path coupled to the analog storage array to play back messages from the analog storage array during a playback operation; and
   a control circuit coupled to the analog storage array, the control circuit to independently control access to one or both of the first and second segments, responsive to first, second, and third inputs coupled thereto.

29. The integrated circuit of claim 28, wherein, responsive to detecting one of the first and second inputs being asserted, and the third input being at a first state, the control circuit to initiate a play operation from one of the first and second segments, respectively, until either an end of message is detected or an end of the respective segment is reached.

30. The integrated circuit of claim 28, wherein, responsive to detecting both the first and second inputs being asserted, and the third input being at a first state, the control circuit to initiate a play operation from the first and second segments, respectively, until either an end of message is detected or an end of the second segment is reached.

31. The integrated circuit of claim 28, wherein the control circuit to initiate a play operation to play a first message from the beginning of the second segment while a second message is being played back from the first segment, responsive to detecting the second input being asserted while the first input is asserted, and the third input being at a first state.

32. The integrated circuit of claim 28, wherein the control circuit to initiate a play operation to play a first message from the beginning of the first segment while a second message is being played back from the second segment, responsive to detecting the first input being asserted while the second input is asserted, and the third input being at a first state.

33. The integrated circuit of claim 28, wherein the control circuit includes a fourth input, the control circuit to prevent recording a signal in one of the first and second segments in the storage array, responsive to the fourth input being asserted.

34. The integrated circuit of claim 28, wherein the control circuit includes a fourth input, the control circuit to cause the output circuit to generate a first tone at the beginning of a record operation to one or both of the first and second segments, responsive to the fourth input.

35. The integrated circuit of claim 34, wherein the control circuit to cause the output circuit to generate a second tone when the end of a segment is reached, responsive to the fourth input.

36. The integrated circuit of claim 28, wherein the control circuit includes an output terminal having an output signal thereon, the control circuit to assert the output signal for driving a light emitting device during a record operation.

* * * * *

UNITED STATES PATENT AND TRADEMARK OFFICE
CERTIFICATE OF CORRECTION

PATENT NO. : 5,959,876  
APPLICATION NO. : 09/115442  
DATED : September 28, 1999  
INVENTOR(S) : Gordon et al.

Page 1 of 1

It is certified that error appears in the above-identified patent and that said Letters Patent is hereby corrected as shown below:

Col. 1, line 66, delete "isle" and insert - - is a - -.

Signed and Sealed this

Twenty-ninth Day of August, 2006

JON W. DUDAS  
*Director of the United States Patent and Trademark Office*